(12) United States Patent
Megaw

(10) Patent No.: US 7,746,153 B1
(45) Date of Patent: Jun. 29, 2010

(54) POWER FET GATE CHARGE RECOVERY

(75) Inventor: David James Megaw, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 404 days.

(21) Appl. No.: 11/938,081

(22) Filed: Nov. 9, 2007

(51) Int. Cl.
*H03K 17/16* (2006.01)
(52) U.S. Cl. ........................ 327/390; 327/589
(58) Field of Classification Search ........... 327/390, 327/589, 588, 389, 391, 586, 392; 323/271, 323/273, 226, 265, 269, 270, 278
See application file for complete search history.

(56) References Cited

U.S. PATENT DOCUMENTS

| | | | |
|---|---|---|---|
| 5,298,797 A | 3/1994 | Redl et al. | |
| 5,313,107 A * | 5/1994 | Itoh | 327/390 |
| 5,883,547 A * | 3/1999 | Diazzi et al. | 327/589 |
| 6,060,948 A * | 5/2000 | Tarantola et al. | 327/589 |
| 6,188,265 B1 * | 2/2001 | Liu et al. | 327/390 |
| 6,967,520 B2 | 11/2005 | Takehara et al. | |
| 7,157,957 B2 * | 1/2007 | Kim | 327/390 |

OTHER PUBLICATIONS

Radoslava Mitova et al., "Fully Integrated Gate Drive Supply Around Power Switches," IEEE Transactions on Power Electronics, May 2005, pp. 650-659, vol. 20, No. 3.

* cited by examiner

*Primary Examiner*—Bao Q Vu
*Assistant Examiner*—Nguyen Tran

(57) ABSTRACT

A circuit for recovering charge at the gate of an output transistor arranged to drive the output of a switching circuit such as a switching regulator or controller. A substantial portion of the charge for each switching cycle is recovered under a wide range of load conditions for the switching circuit, e.g., no load, partial load, or full load. Also, charge recovery operates effectively with a switching circuit that is arranged to switch in a synchronous or asynchronous manner. Additionally, if the output voltage of a switching circuit is 12 or more volts, the amount of charge that can be saved can be relatively substantial.

20 Claims, 4 Drawing Sheets

The amount of recovered charge can be estimated:

Normal:

$$Q_{LOST} = Q_{GATE} + Q_{SW} = (C_{GATE} \cdot V_{GATE}) + (C_{SW} \cdot V_{IN}) = \left\{\frac{C_{GATE} \cdot C_{SW}}{C_{GATE} + C_{SW}}\right\}(V_{IN} + V_{REG} - V_{DIODE})$$

With gate charge recovery:

$$Q_{RECOVERED} = \left\{\frac{C_{GATE} \cdot C_{SW}}{C_{GATE} + C_{SW}}\right\}(V_{IN} + V_{REG} - V_{DIODE} - V_{REG} - V_{DIODE}) = \left\{\frac{C_{GATE} \cdot C_{SW}}{C_{GATE} + C_{SW}}\right\}(V_{IN} - 2V_{DIODE})$$

$$\frac{Q_{RECOVERED}}{Q_{LOST}} = \frac{(V_{IN} - 2V_{DIODE})}{(V_{IN} + V_{REG} - V_{DIODE})} \approx \frac{V_{IN}}{V_{IN} + V_{REG}}$$

FIG. 5A $$Q_{RECOVER\_M2} \cong \frac{V_{REG} - V_{LV}}{V_{REG}} \cdot Q_{GATE2}$$

FIG. 5B

POWER FET GATE CHARGE RECOVERY

FIELD OF THE INVENTION

This invention is directed to electronic regulator circuits, and more particularly to, conserving energy in switching Direct Current to Direct Current (DC-DC) regulation circuits.

BACKGROUND OF THE INVENTION

Mobile devices are typically powered by batteries, and the life of these batteries is determined by battery size and device's power consumption efficiency. In part to improve this efficiency, a mobile device often employs several switching regulators to efficiently convert a battery's energy into electrical power for use by other electronic components in the mobile device. Mobile devices can include mobile telephones, pagers, portable game consoles, and personal digital assistants, and the like.

A higher switching frequency is desirable in a switching regulator because it allows for the use of smaller value/size electronic components external to the regulator, such as inductors and capacitors, and can reduce the Electro-Magnetic Interference (EMI) interference in neighboring electronic components. The upper bound for switching frequency is generally limited by the efficiency requirements for the regulator. For example, as the switching frequency or input voltage increases, the transitional losses and gate charge losses to parasitic capacitances also increases in a relatively linearly dependent manner. In the past, these losses have made it difficult to achieve efficiency at relatively higher switching frequencies, especially for a relatively high input voltage, e.g., 12 volts, that is regulated with a relatively high switching frequency, such as 500 kilohertz.

To improve the efficiency of a switching regulator, the transitional losses can be reduced by reducing time taken for the power Field Effect Transistor (FET) to transition from on to off and off to on. However, the gate charge loss (energy required to charge and discharge the gate capacitance of the power FET for each cycle) is a fixed quantity for a given input voltage and switching frequency. On the other hand, if a substantial portion of the gate charge could be recovered each switching cycle, then the efficiency of a switching regulator could be made less dependent on its switching frequency. In other words, the switching regulator could operate at a higher switching frequency without the associated theoretical penalty in efficiency.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description Of The Embodiments, which is to be read in association with the accompanying drawings, wherein:

FIG. 5A illustrates the equations that express the lost charge in normal operation and the charge recovered by the invention for an asynchronous switching regulator;

FIG. 5B shows an equation that expresses the gate charge recovered for a synchronous switching regulator.

DETAILED DESCRIPTION OF THE EMBODIMENTS

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the invention is directed to recovering at least a portion of the charge at the gate of a switch arranged to drive the output of a switching circuit such as a switching regulator or controller. Further, the invention can be arranged to recover a substantial portion of the charge for each switching cycle under a wide range of load conditions for the switching circuit, e.g., no load, partial load, or full load. Also, in one or more embodiments, the invention can operate effectively with a switching circuit that is arranged to switch in a synchronous or asynchronous manner. Additionally, in one or more embodiments, if the output voltage of a switching circuit is 12 or more volts, the amount of charge that can be saved by the operation of the invention can be relatively substantial.

Figure 1:
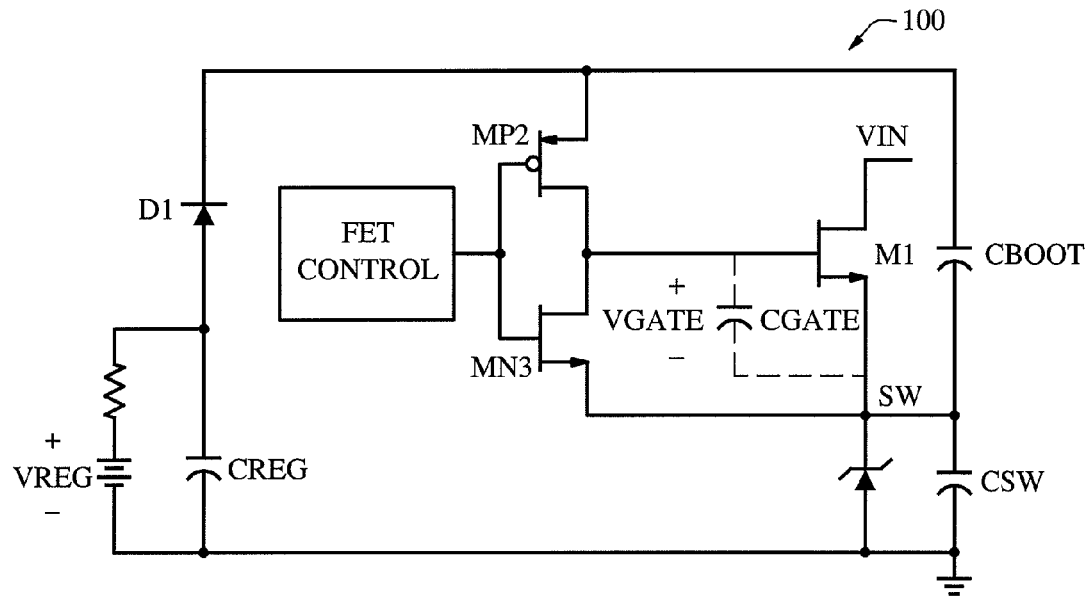
FIG. 1 illustrates an exemplary schematic of an asynchronous buck switching regulator.

FIG. 1 illustrates an exemplary schematic of the power stage of an asynchronous buck switching regulator 100. As shown, when PMOS switching transistor MP2 conducts and NMOS switching transistor MN3 is not conducting, then NMOS output transistor M1 conducts and the voltage at its source (SW) is pulled up to the voltage at its drain (VIN) minus the resistive drop across the device itself. Conversely, if transistor MP2 is not conducting and MN3 is conducting, the gate of the output transistor M1 is shorted to it source and the device is in cutoff. When M1 is not conducting, the voltage at its source (SW) is pulled below GND as current flows through the free-wheeling diode. A FET control circuit is coupled to a gate of switching transistor MP2 and the circuit is also coupled to a gate of switching transistor MN3. The conduction of switching transistors MP2 and MN3 are controlled by the operation of the FET control circuit.

Additionally, a positive terminal of a regulated voltage supply (VREG) is coupled through a resistive element and a diode (D1) to a source terminal of switching transistor MP2 and an anode of a boot capacitor (CBOOT). The cathode of the boot capacitor is coupled to the source of switching transistor M1 (SW). Capacitor (CSW) represents all parasitic capacitance on the switching node (SW). Furthermore, an external capacitor (CREG) is coupled between ground and an end of the resistive element that has its other end coupled to the positive terminal of the regulated voltage supply (VREG).

Furthermore, when the output transistor M1 is conducting, a parasitic capacitance of charge typically collects between the M1 transistor's gate terminal and its source terminal. For circuit 100 shown in FIG. 1, the collected charge at the M1 gate terminal is not recovered. Rather, the energy stored on capacitor CGATE is dissipated in MN3 when MN3 conducts.

In operation, the output transistor M1 is turned on when MP2 allows current to charge its gate-to-source voltage to some value above its threshold. The gate charge, $Q_{GATE} = (V_{GATE} \times C_{GATE})$, is provided by $C_{BOOT}$, which is initially charged by the voltage VREG through diode D1 when M1 is off. When turning M1 off, $C_{GATE}$ is shorted with MN3 such that the gate charge is dissipated—returning the gate-to-source voltage to zero. This charging/discharging process takes place every switching cycle leading to a frequency dependent power loss. In higher power applications the gate capacitance of the power FET (output transistor M1) can vary from nanofarads to tens of nanofarads and the power loss can be significant.

Figure 2:
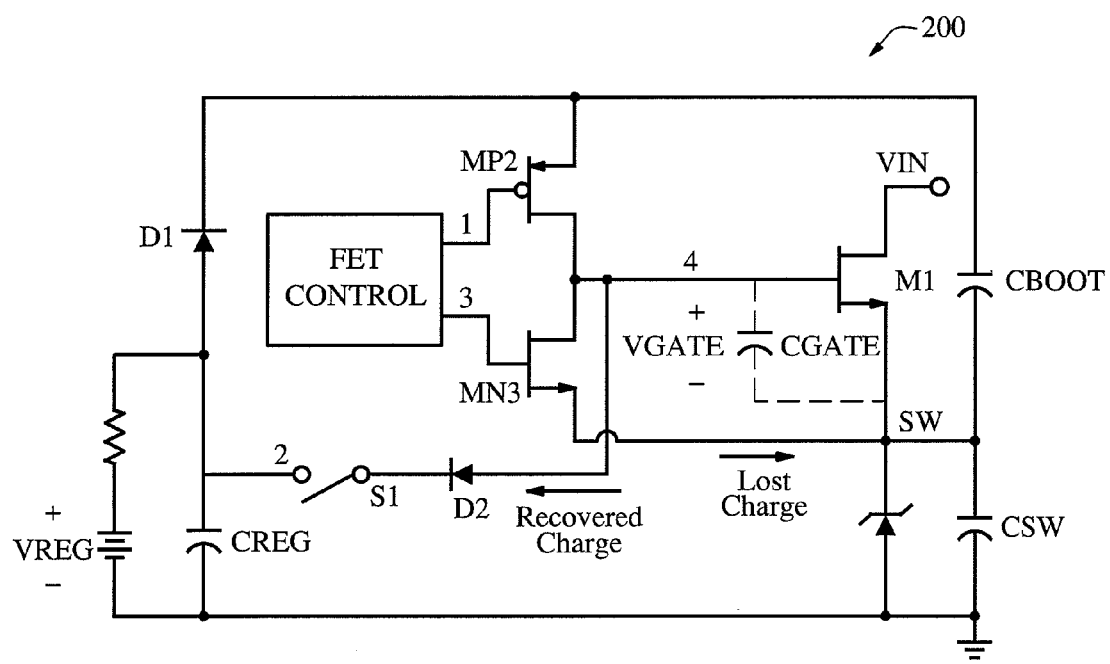
FIG. 2 shows an exemplary schematic of an asynchronous buck switching regulator with gate charge recovery.

FIG. 2 shows an exemplary schematic of an asynchronous buck switching regulator circuit 200 that is arranged in substantially the same manner as circuit 100 shown in FIG. 1, except that circuit 200 further includes additional components that enable recovery of charge that collects at the gate terminal of output transistor M1 during conduction.

As shown in FIG. 2, a switching device (S1) has one end coupled to the positive terminal of the regulated voltage supply and the anode of a capacitor CREG, which has its cathode coupled to the negative terminal of the regulated voltage supply. The other end of switching device S1 is coupled to the gate terminal of output transistor M1, and the drain terminals of switching transistors MP2 and MN3. Additionally, the FET control circuit is separated coupled to the gate terminals of switching transistors MP2 and MN3. In this arrangement, the FET control circuit can independently control the conduction of the switching transistors MP2 and MN3.

Optionally, a diode (D2) can be coupled between the other end of switching device S1 and the gate terminal of output transistor M1, and the drain terminals of switching transistors MP2 and MN3. The exemplary arrangement of optional diode D2 enables charge to flow to capacitor CREG from the gate terminal of output transistor M1, while preventing an untimely flow of charge in the opposite direction, i.e., from capacitor CREG directly to the gate terminal of output transistor M1.

Additionally, a Zener Diode and a capacitor CSW is coupled between the negative terminal of the regulated voltage supply and the source terminals of output transistor M1 and switching transistor MN3.

In operation, switching transistor MP2 is turned on by the FET control which causes the output transistor M1 to also turn on and provide an output voltage at node SW. After switching transistor MP2 has turned off, switching device S1 turns on enables charge to flow from the gate terminal of the output transistor M1 to capacitor CREG. At this time a relatively large portion of the charge that has collected in the parasitic capacitance at the gate terminal of output transistor M1 is recovered in capacitor CREG.

Next, switching transistor MN3 turns on and pulls the gate terminal of output transistor M1 to relatively the same voltage as its source (SW). A relatively small portion of the charge at the gate terminal of output transistor M1 that was not recovered in capacitor CREG is instead drained into capacitor CSW where it is subsequently dissipated to ground. However, in at least one other embodiment, the switching device S1 is cycled on and off before MN3 is turned on. After a period of time, both the switching device S1 and the switching transistor MN3 are turned off, and then the switching transistor MP2 is turned on again. Once switching transistor MP2 turns on again, the recovered charge in capacitor CREG can flow back to the gate terminal of output transistor M1, which causes it to turn on and provide an output voltage again at node SW.

Figure 3:
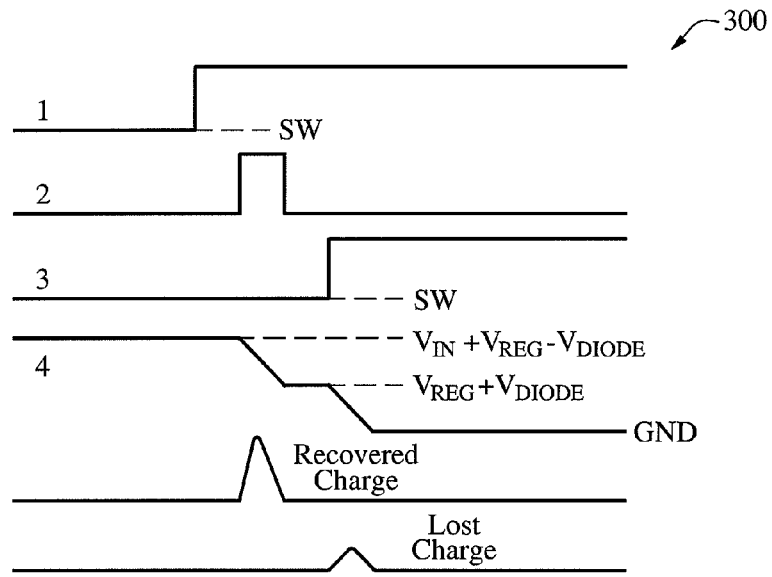
FIG. 3 illustrates an exemplary timing diagram of the operation of components in an asynchronous buck switching regulator with gate charge recovery.

FIG. 3 illustrates an exemplary timing diagram of the operation of components for a switching regulator with gate charge recovery such as discussed above for FIG. 2. As shown at line 1, switching transistor MP2 is first turned off, then after a period of time, at line 2, the switching device S1 is turned on which causes charge from the gate terminal of the output transistor M1 to be recovered such as at capacitor CREG. Switching device is turned off and then a line 3 the switching transistor MN3 is turned on so that the output transistor M1 is completely turned off and the remaining charge at the gate terminal of output transistor M1 is dissipated. Although not shown, once switching transistor MP2 turns back on, a path is provided for the recovered charge at capacitor CREG to flow back to the gate terminal of output transistor M1, which causes it to turn on and provide the output voltage again at node SW.

Additionally, FIG. 3 generally teaches a method for recovering a majority of the charge at the gate terminal for an output transistor M1 in a switching circuit. Rather than shorting the parasitic capacitance CGATE through MN3, the switching device S1 provides a path through which the charge at the gate terminal of M1 can flow back onto the capacitor CREG when M1 is turned off. When $M_1$ is on, its gate voltage is $(V_{IN} + V_{REG} - V_{DIODE})$ with respect to ground, or $(V_{IN} - V_{DIODE})$ with respect to $V_{REG}$. This difference in potential is what causes charge to flow from the gate of M1 through D2 to the CREG capacitor. Once the voltage at the gate terminal of output transistor M1 has dropped to roughly $(V_{REG} + V_{DIODE})$ with respect to ground, charge will stop flowing and switching device S1 can be turned off/opened. The turn-off transition is completed when MN3 is subsequently turned on, which shorts CGATE to ground and dissipates the remainder of the gate charge.

Figure 4:
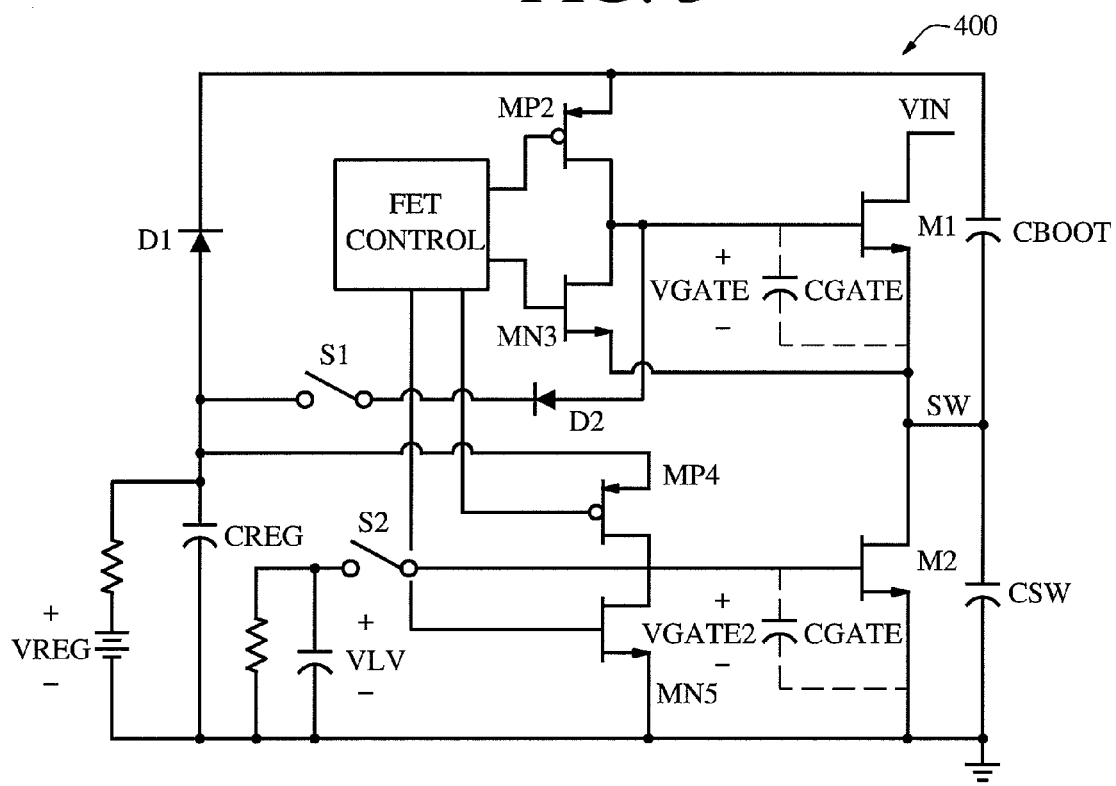
FIG. 4 shows an exemplary schematic of a synchronous buck switching regulator with gate charge recovery.

FIG. 4 shows an exemplary schematic of a synchronous buck switching regulator that is arranged to provide for gate charge recovery for the high side and low side voltages provided at the output node SW in a manner substantially similar to the asynchronous switching regulator discussed above for FIG. 2. In many applications, the linear and control blocks of a switching regulator do not require as much voltage drive as the power FETs, and a low voltage rail may be provided by the regulated voltage supply to power them. Just as is the case with the high side FET, M1, a portion of the gate charge on M2 maybe recovered to an external capacitor CLV due to the difference in potentials. As shown in FIG. 4, if VLV is designed to be roughly half of VREG, it is possible to recover half of the charge at the gate terminal of low side output transistor M2. Depending on the arrangement of components, this could exceed the average current draw on VLV, but this arrangement of components will mitigate this source of charge loss for the synchronous switching circuit. In some embodiments, the implementation of both high side and low side gate charge recovery components can reduce the total gate charge loss by up to 60-80%.

As shown in FIG. 4, switching device (S1) has one end coupled to the positive terminal of the regulated voltage supply and the anode of a capacitor CREG, which has its cathode coupled to the negative terminal of the regulated voltage supply. The other end of switching device S1 is coupled to the gate terminal of high side output transistor M1, and the drain terminals of switching transistors MP2 and MN3. Additionally, the FET control circuit is separated coupled to the gate terminals of switching transistors MP2 and MN3. In this arrangement, the FET control circuit can independently control the conduction of the switching transistors MP2, MN3, MP4, and MN5.

Optionally, a diode (D2) can be coupled between the other end of switching device S1 and the gate terminal of high side output transistor M1, and the drain terminals of switching transistors MP2 and MN3. The exemplary arrangement of optional diode D2 enables charge to flow to the anode of capacitor CREG from the gate terminal of output transistor M, while also preventing a back flow of charge in the opposite direction, i.e., from capacitor CREG to the gate terminal of output transistor M1.

Additionally, a capacitor CSW is coupled between the negative terminal of the regulated voltage supply and the drain terminal of low voltage output transistor M2 and the source terminal of high side output transistor M1. In operation, the capacitor CSW smoothes the output voltage provided at terminal SW by output transistors M1 and M2.

As shown in FIG. 4, another switching device S2 has one end coupled to the anode of a capacitor CLV, which has its cathode coupled to the negative terminal of the regulated voltage supply. The other end of switching device S2 is coupled to the gate terminal of the low side output transistor M2, and the drain terminals of switching transistors MP4 and MN5. Additionally, the FET control circuit is separated coupled to the gate terminals of switching transistors MP4 and MN5. In this arrangement, the FET control circuit independently controls the conduction of the switching transistors MP4 and MN5, which causes the low side output transistor M2 to turn on and off. In operation, the arrangement of switching device S2 and capacitor CLV enables the recovery of at least a portion of the charge that collects at the gate terminal of low side transistor M2.

FIG. 5A shows several equations for estimating the amount of recovered charge for an asynchronous switching circuit in comparison to the amount of charge typically lost without such an arrangement of components as disclosed above. In this case, the amount of charge that can be recovered divided by the amount of charge normally lost is relatively equivalent to the input voltage divided by the sum of the input voltage and the voltage provided by the regulated voltage supply.

FIG. 5B shows an equation for estimating the amount of charge that is recovered for the low voltage side of a synchronous switching circuit. In this case, the amount of charge that can be recovered is relatively equivalent to the charge at the gate terminal of the low voltage output transistor multiplied by the difference between the voltage provided by the regulated voltage supply minus the voltage across capacitor CLV (as shown in FIG. 4) which is then divided by the regulated voltage.

Additionally, there are some practical considerations to consider to make use of the inventive gate charge recovery effectively. First, the capacitors onto which recovered gate charge is stored (CREG and CLV) should be relatively substantially larger than the gate parasitic capacitance of the output transistors, M1 or M2. Consequently, in most cases capacitors CREG and CLV are arranged as external capacitors. These relatively large external capacitors limit the change in voltage to $V_{GATE}$ times the ratio of the gate capacitance to external capacitor. This arrangement of relatively large external capacitors further limits the noise on the $V_{REG}$ and $V_{LV}$ voltage supply rails provided by the regulated voltage supply. Secondly, switching devices $S_1$ and $S_2$ should be arranged and sized with comparable on resistances as switching transistors MN3 and MN5. In this way, charge can be transferred quickly so that other types of losses are not significantly increased. Also, it is noteworthy that switching device S2 should be arranged to withstand high drain-to-source and gate-to-source voltages. Also, as discussed above, Diode D2 is optional, but may be included as a precaution against charge moving the wrong way. However, the removal of diode D2 should improve recovery efficiency in the circuit.

Figure 6:
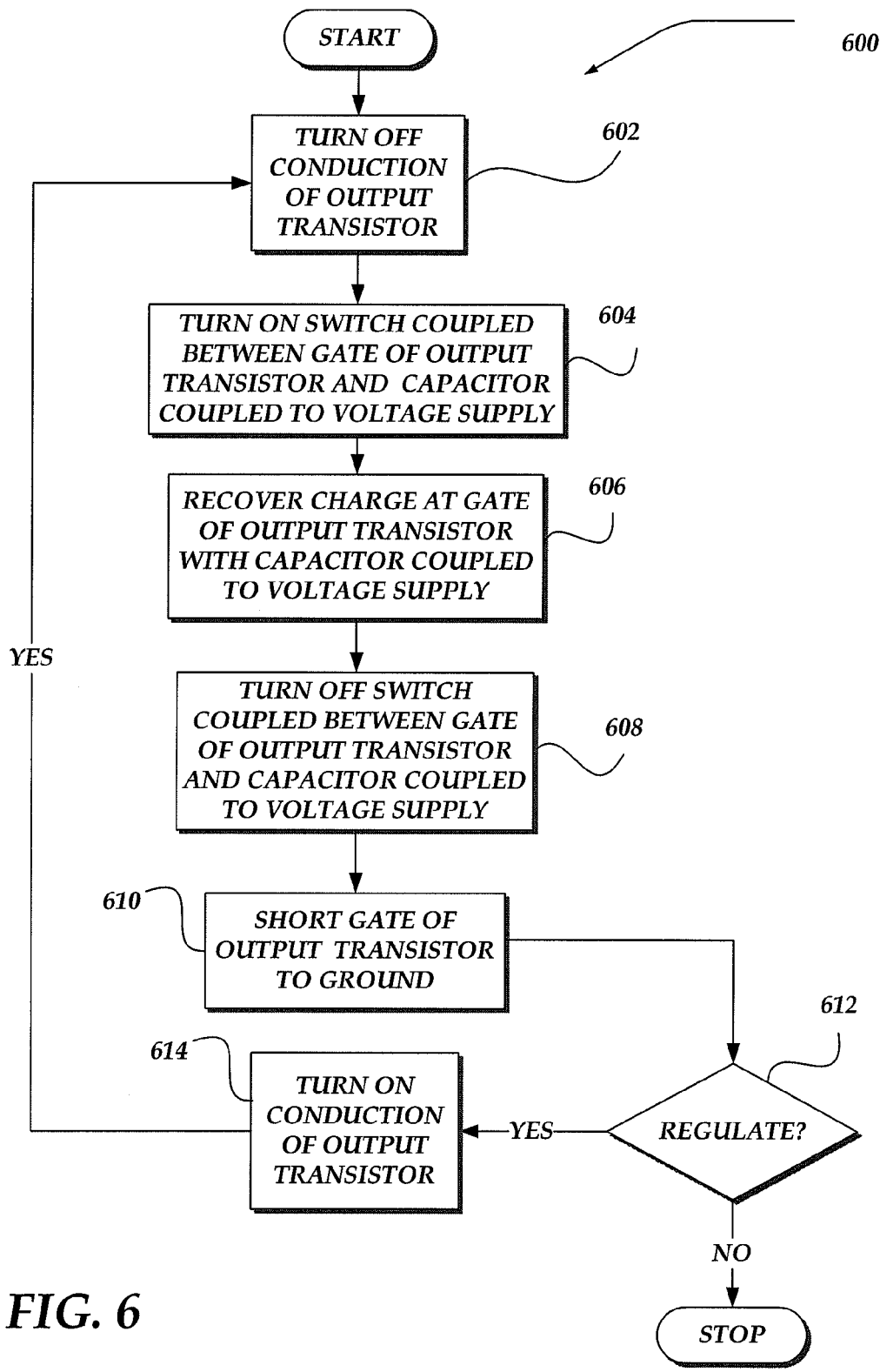
FIG. 6 illustrates a flowchart for recovering gate charge, in accordance with the invention.

FIG. 6 illustrates a flow chart of process 600 for recovering charge with a switching circuit. Moving from a start block, the process steps to block 600 where conduction of an output transistor is turned off. At block 604, a switch coupled between the gate terminal of the output transistor and a capacitor coupled to a voltage supply is closed so that a charge recovery bypass path is provided. Flowing to block 606, charge at the gate terminal flows through the switch to the capacitor coupled to the voltage supply. Moving to block 608, the process turns off the switch and opens the bypass path so that charge can no longer flow from the gate terminal to the capacitor.

Next, at block 610, the gate terminal of the output transistor is shorted to its source. At decision block 612 a determination is made as to whether or not continue regulating the switching circuit. If negative, the process of charge recovery stops and returns to performing other actions. However, if the determination at decision block 612 is to continue regulating, then the process steps to block 614 where the output transistor is turned on again. Next, the process loops back to block 602 where it performs again substantially the same actions discussed above.

It will be understood that each block of the above flowchart illustrations, and combinations of blocks in the flowchart illustrations, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions executing on the processor provide steps for implementing the actions listed in the flowcharts discussed above.

Accordingly, blocks of the flowchart illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed as new and desired to be protected by Letters Patent of the United States is:

1. A voltage regulation circuit that is arranged to recover charge at a gate of an output transistor, comprising:
   a first switching transistor having a drain terminal that is coupled to the gate of the output transistor and a source terminal that is coupled to a positive terminal of a boot strap capacitor, wherein the conduction of the first switching transistor enables the output transistor to also conduct and to provide a positive output voltage at a source terminal of the output transistor that is coupled to an output terminal;
   a second switching transistor having a drain terminal that is coupled to the gate of the output transistor and a source terminal that is coupled to the source terminal of the output transistor, wherein conduction of the second switching transistor enables the output transistor to stop conducting and which causes a voltage at or below ground to be provided at the source terminal of the output transistor;
   a switching device that is coupled between the gate of the output transistor and a capacitor coupled to a positive terminal of a voltage supply, wherein the switching device is arranged to start conducting as the output transistor transitions from conduction to non-conduction, and wherein the conduction of the switching device enables at least a portion of charge at the gate of the output transistor to flow to the capacitor coupled to the positive terminal of the voltage supply; and
   a control circuit that is separately coupled to a gate of the first switching transistor and a gate of the second switching transistor, wherein the operation of the control circuit is arranged to separately control when the first and second switching transistors separately transition between conduction and non-conduction so that the charge at the capacitor is reused at the gate terminal of the output transistor to enable its conduction.

2. The circuit of claim 1, wherein the control circuit is further arranged to enable the second switching transistor to conduct after the switching device starts conducting and which enables at least another portion of charge at the gate of the output terminal to flow to the ground voltage.

3. The circuit of claim 1, wherein the switching device is arranged to conduct at least when the output transistor is switching from conduction to non-conduction.

4. The circuit of claim 1, wherein the control circuit is arranged to enable the conduction of at least the first and second switching transistors in an asynchronous manner.

5. The circuit of claim 1, wherein the voltage supply includes a negative terminal that is coupled to the ground voltage and the positive terminal of the voltage supply is coupled through a diode to the source terminal of the first switching transistor.

6. The circuit of claim 1, further comprising a boot capacitor having an anode coupled to the positive terminal of the voltage supply and the source terminal of the first switching transistor, wherein the boot capacitor is arranged to provide charge to the gate of the output transistor if the first switching transistor is conducting.

7. The circuit of claim 1, wherein the positive output voltage is based on at least an input voltage that is coupled to a drain terminal of the output transistor.

8. The circuit of claim 1, wherein an anode of an external regulation capacitor is coupled to the positive terminal of the voltage supply and a cathode of the external regulation capacitor is coupled to a negative terminal of the voltage supply.

9. The circuit of claim 1, further comprising a low side regulated voltage that is less than the voltage supply's positive terminal, and another switching device and a third switching transistor and a fourth switching transistor that are arranged with the low side regulated voltage so that a low side output voltage and a high side output voltage are provided synchronously at the output terminal.

10. The circuit of claim 9, wherein the control circuit is arranged to enable the conduction of at least the first, second, third, and fourth switching transistors at a particular frequency in a synchronous manner.

11. The circuit of claim 9, wherein the charge is recovered at the capacitor under a wide range of load conditions, including at least one of no load, partial load, or full load.

12. A synchronous voltage regulation circuit that is arranged to recover charge at a gate of a first output transistor and a gate of a second output transistor, comprising:
   a first switching transistor that is arranged to enable the first output transistor to conduct and to provide a positive output voltage at a source terminal of the first output transistor that is coupled to an output terminal;
   a second switching transistor that is arranged to enable the first output transistor to stop conduction and which enables a voltage at or below ground to be provided to the source terminal of the first output transistor;
   a first switching device that is coupled between the gate of the first output transistor and a first capacitor coupled to a high side positive terminal of a voltage supply, wherein the conduction of the first switching device enables at least a portion of charge at the gate of the first output transistor to be recovered at the first capacitor coupled to the high side positive terminal of the voltage supply;
   a third switching transistor that is arranged to enable the second output transistor to conduct, wherein the conduction of the second output transistor provides a low side positive output voltage at a source terminal of the second output transistor that is coupled to the output terminal;
   a fourth switching transistor that is arranged to control the non-conduction of the second output transistor and which enables a voltage to be provided at or below ground at the source terminal of the second output transistor;
   a second switching device that is coupled between the gate of the second output transistor and a second capacitor coupled to a low side positive voltage, wherein the conduction of the second switching device enables at least a portion of the charge at the gate of the second output transistor to be recovered at the second capacitor coupled to the low side positive voltage; and
   a control circuit that is separately coupled to a gate of the first switching transistor, a gate of the second switching transistor, a gate of the third switching transistor, and a gate of the fourth switching transistor, wherein the control circuit is arranged to separately control the conduction and non-conduction of the first, second, third, and fourth switching transistors, and wherein the conduction of the first switching transistor enables charge recovered at the first capacitor to be reused at the gate of the first output transistor to enable its conduction and the conduction of the second switching transistor enables charge recovered at the second capacitor to be reused at the gate of the second output transistor to also enable its conduction.

13. The circuit of claim 11, wherein an anode of a first external regulation capacitor is coupled to the positive terminal of the voltage supply and a cathode of the first external regulation capacitor is coupled to a negative terminal of the voltage supply.

14. The circuit of claim 11, wherein an anode of a second external regulation capacitor is coupled to the low side positive voltage and a cathode of the second external regulation capacitor is coupled to the negative terminal of the voltage supply.

15. The circuit of claim 11, further comprising a boot capacitor having an anode coupled to the positive terminal of the voltage supply and the source terminal of the first switching transistor, wherein the boot capacitor is arranged to provide charge to the gate of the first output transistor if the first switching transistor is conducting.

16. The circuit of claim 14, wherein a cathode of the boot capacitor is coupled to the source terminal of the output transistor, the source terminal of the fourth switching transistor, and an anode of a switching capacitor, and wherein a cathode of the switching capacitor is coupled to the ground voltage.

17. The circuit of claim 11, wherein the charge is recovered at the first and second capacitors under a wide range of load conditions, including at least one of no load, partial load, or full load.

18. A method for recovering charge from a gate of an output transistor in a voltage regulation circuit, comprising:
    disabling conduction of a first switching transistor to cause the output transistor to also stop conducting and stop providing an output voltage at an output terminal based on an input voltage;
    enabling conduction and subsequent non-conduction of a switching device to recover at least a portion of charge at a gate of the output transistor at a bypass capacitor coupled to a voltage supply if the first switching transistor and the output transistor are disabled from conducting;
    enabling conduction of a second switching transistor to drain a remaining portion of charge at the gate of the output transistor to ground if the output transistor and the switching device are non-conducting; and
    enabling the recovered charge at the bypass capacitor to be provided at the gate of the output transistor to enable its conduction if the first switching transistor is conducting and the second switching transistor is non-conducting.

19. The method of claim 18, wherein the charge is recovered at the bypass capacitor under a wide range of load conditions, including at least one of no load, partial load, or full load.

20. The method of claim 18, wherein the voltage regulation circuit is arranged to switch in at least one of a synchronous or an asynchronous manner.

* * * * *